(12) United States Patent
Campbell

(10) Patent No.: US 6,888,155 B2
(45) Date of Patent: May 3, 2005

(54) STOICHIOMETRY FOR CHALCOGENIDE GLASSES USEFUL FOR MEMORY DEVICES AND METHOD OF FORMATION

(75) Inventor: Kristy A. Campbell, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/603,670

(22) Filed: Jun. 26, 2003

(65) Prior Publication Data
US 2004/0007718 A1 Jan. 15, 2004

Related U.S. Application Data

(63) Continuation of application No. 09/941,544, filed on Aug. 30, 2001, now abandoned.

(51) Int. Cl.[7] ............................................. H01L 31/0328
(52) U.S. Cl. ................... 257/2; 257/3; 257/4; 365/153
(58) Field of Search .......................... 257/2–5, 52, 55, 257/63, 296–300; 501/11, 19, 42; 365/129, 153

(56) References Cited

U.S. PATENT DOCUMENTS

| | | | |
|---|---|---|---|
| 3,271,591 A | 9/1966 | Ovshinsky |
| 3,961,314 A | 6/1976 | Klose et al. |
| 3,966,317 A | 6/1976 | Wacks et al. |

(Continued)

FOREIGN PATENT DOCUMENTS

| | | | |
|---|---|---|---|
| JP | 403044703 A | * 2/1991 | ........... G05B/19/05 |
| WO | WO 97/48032 | 12/1997 | |
| WO | WO 99/28914 | 6/1999 | |
| WO | WO 00/48196 | 8/2000 | |
| WO | WO 02/21542 | 3/2002 | |

OTHER PUBLICATIONS

Merriam Webster's Collegiate Dictionary, 10th Edition, ISBN 8–87779–708–0 (1999), p. 495, meaning 1of glass.*

M. Mitkova et al, "Dual Chemical Role of Ag as an Additive in Chalcogenide Glasses", Physical Review Letters, vol. 83, No. 19, pp. 3848–3851 (Nov. 1999) (IDS).*

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi,M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

(Continued)

Primary Examiner—Nathan J. Flynn
Assistant Examiner—Johannes Mondt
(74) Attorney, Agent, or Firm—Dickstein Shapiro Morin & Oshinsky LLP

(57) ABSTRACT

A method of forming resistance changing elements with improved operational characteristics for use in memory devices and the resulting structures are disclosed. A chalcogenide glass having the formula $(Ge_{x1}Se_{1-x1})_{1-y1}Ag_{y1}$, wherein $18 \leq x_1 \leq 28$, or the formula $(Ge_{x2}Se_{1-x2})_{1-y2}Ag_{y2}$, wherein $39 \leq x_2 \leq 42$, and wherein in both the silver is in a concentration which maintains the germanium selenide glass in the glass forming region is used in a memory cell. The glass may also have a glass transition temperature (Tg) near or higher than typical temperatures used for fabricating and packaging memory devices containing the memory cell.

20 Claims, 6 Drawing Sheets

U.S. PATENT DOCUMENTS

| | | | |
|---|---|---|---|
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,673,957 A | 6/1987 | Ovshinsky et al. | |
| 4,678,679 A | 7/1987 | Ovshinsky | |
| 4,696,758 A | 9/1987 | Ovshinsky et al. | |
| 4,698,234 A | 10/1987 | Ovshinsky et al. | |
| 4,710,899 A | 12/1987 | Young et al. | |
| 4,728,406 A | 3/1988 | Banerjee et al. | |
| 4,737,379 A | 4/1988 | Hudgens et al. | |
| 4,766,471 A | 8/1988 | Ovshinsky et al. | |
| 4,769,338 A | 9/1988 | Ovshinsky et al. | |
| 4,775,425 A | 10/1988 | Guha et al. | |
| 4,788,594 A | 11/1988 | Ovshinsky et al. | |
| 4,809,044 A | 2/1989 | Pryor et al. | |
| 4,818,717 A | 4/1989 | Johnson et al. | |
| 4,843,443 A | 6/1989 | Ovshinsky et al. | |
| 4,845,533 A | 7/1989 | Pryor et al. | |
| 4,853,785 A | 8/1989 | Ovshinsky et al. | |
| 4,891,330 A | 1/1990 | Guha et al. | |
| 5,128,099 A | 7/1992 | Strand et al. | |
| 5,159,661 A | 10/1992 | Ovshinsky et al. | |
| 5,166,758 A | 11/1992 | Ovshinsky et al. | |
| 5,177,567 A | 1/1993 | Klersy et al. | |
| 5,272,667 A * | 12/1993 | Yamada et al. | 365/113 |
| 5,296,716 A | 3/1994 | Ovshinsky et al. | |
| 5,335,219 A | 8/1994 | Ovshinsky et al. | |
| 5,341,328 A | 8/1994 | Ovshinsky et al. | |
| 5,359,205 A | 10/1994 | Ovshinsky | |
| 5,406,509 A | 4/1995 | Ovshinsky et al. | |
| 5,414,271 A | 5/1995 | Ovshinsky et al. | |
| 5,500,532 A | 3/1996 | Kozicki | |
| 5,534,711 A | 7/1996 | Ovshinsky et al. | |
| 5,534,712 A | 7/1996 | Ovshinsky et al. | |
| 5,536,947 A | 7/1996 | Klersy et al. | |
| 5,543,737 A | 8/1996 | Ovshinsky | |
| 5,591,501 A | 1/1997 | Ovshinsky et al. | |
| 5,596,522 A | 1/1997 | Ovshinsky et al. | |
| 5,687,112 A | 11/1997 | Ovshinsky | |
| 5,694,054 A | 12/1997 | Ovshinsky et al. | |
| 5,714,768 A | 2/1998 | Ovshinsky et al. | |
| 5,751,012 A | 5/1998 | Wolstenholme et al. | |
| 5,761,115 A * | 6/1998 | Kozicki et al. | 365/182 |
| 5,789,277 A | 8/1998 | Zahorik et al. | |
| 5,825,046 A | 10/1998 | Czubatyj et al. | |
| 5,892,826 A * | 4/1999 | Brown et al. | 713/190 |
| 5,896,312 A | 4/1999 | Kozicki et al. | |
| 5,912,839 A | 6/1999 | Ovshinsky et al. | |
| 5,914,893 A | 6/1999 | Kozicki et al. | |
| 5,933,365 A | 8/1999 | Klersy et al. | |
| 6,011,757 A | 1/2000 | Ovshinsky | |
| 6,084,796 A | 7/2000 | Kozicki et al. | |
| 6,087,674 A | 7/2000 | Ovshinsky et al. | |
| 6,141,241 A | 10/2000 | Ovshinsky et al. | |
| 6,200,870 B1 * | 3/2001 | Yeh et al. | 438/302 |
| 6,226,308 B1 * | 5/2001 | Samson et al. | 372/40 |
| RE37,259 E | 7/2001 | Ovshinsky | |
| 6,339,544 B1 | 1/2002 | Chiang et al. | |
| 6,348,365 B1 | 2/2002 | Moore et al. | |
| 6,388,324 B2 | 5/2002 | Kozicki | |
| 6,404,665 B1 | 6/2002 | Lowery et al. | |
| 6,418,049 B1 | 7/2002 | Kozicki et al. | |
| 6,429,064 B1 | 8/2002 | Wicker | |
| 6,437,383 B1 | 8/2002 | Xu | |
| 6,462,984 B1 | 10/2002 | Xu et al. | |
| 6,469,364 B1 | 10/2002 | Kozicki | |
| 6,480,438 B1 | 11/2002 | Park | |
| 6,487,106 B1 * | 11/2002 | Kozicki | 365/153 |
| 6,487,113 B1 | 11/2002 | Park et al. | |
| 6,501,111 B1 | 12/2002 | Lowery | |
| 6,507,061 B1 | 1/2003 | Klersy et al. | |
| 6,511,862 B2 | 1/2003 | Hudgens et al. | |
| 6,511,867 B2 | 1/2003 | Lowery et al. | |
| 6,512,241 B1 | 1/2003 | Lai | |
| 6,514,805 B2 | 2/2003 | Xu et al. | |
| 6,531,373 B2 | 3/2003 | Gill et al. | |
| 6,534,781 B2 | 3/2003 | Dennison | |
| 6,545,287 B2 | 4/2003 | Chiang | |
| 6,545,907 B1 | 4/2003 | Lowery et al. | |
| 6,555,860 B2 | 4/2003 | Lowery et al. | |
| 6,563,164 B2 | 5/2003 | Lowery et al. | |
| 6,566,700 B2 | 5/2003 | Xu | |
| 6,567,293 B1 | 5/2003 | Lowery et al. | |
| 6,569,705 B2 | 5/2003 | Chiang et al. | |
| 6,570,784 B2 | 5/2003 | Lowrey | |
| 6,576,921 B2 | 6/2003 | Lowrey | |
| 6,586,761 B2 | 7/2003 | Lowrey | |
| 6,589,714 B2 | 7/2003 | Maimon et al. | |
| 6,590,807 B2 | 7/2003 | Lowrey | |
| 6,593,176 B2 | 7/2003 | Dennison | |
| 6,597,009 B2 | 7/2003 | Wicker | |
| 6,605,527 B2 | 8/2003 | Dennison et al. | |
| 6,613,604 B2 | 9/2003 | Maimon et al. | |
| 6,621,095 B2 | 9/2003 | Chiang et al. | |
| 6,625,054 B2 | 9/2003 | Lowery et al. | |
| 6,635,914 B2 | 10/2003 | Kozicki et al. | |
| 6,642,102 B2 | 11/2003 | Xu | |
| 6,646,297 B2 | 11/2003 | Dennison | |
| 6,649,928 B2 | 11/2003 | Dennison | |
| 6,667,900 B2 | 12/2003 | Lowery et al. | |
| 6,671,710 B2 | 12/2003 | Ovshinsky et al. | |
| 6,673,648 B2 | 1/2004 | Lowrey | |
| 6,673,700 B2 | 1/2004 | Dennison et al. | |
| 6,674,115 B2 | 1/2004 | Hudgens et al. | |
| 6,687,153 B2 | 2/2004 | Lowery | |
| 6,687,427 B2 | 2/2004 | Ramalingam et al. | |
| 6,690,026 B2 | 2/2004 | Peterson | |
| 6,696,355 B2 | 2/2004 | Dennison | |
| 6,707,712 B2 | 3/2004 | Lowery | |
| 6,714,954 B2 | 3/2004 | Ovshinsky et al. | |
| 2002/0000666 A1 | 1/2002 | Kozicki et al. | |
| 2002/0168820 A1 * | 11/2002 | Kozicki et al. | 438/259 |
| 2003/0048744 A1 | 3/2003 | Ovshinsky et al. | |
| 2003/0209728 A1 * | 11/2003 | Kozicki et al. | 257/200 |
| 2003/0212724 A1 | 11/2003 | Ovshinsky et al. | |
| 2003/0212725 A1 | 11/2003 | Ovshinsky et al. | |
| 2004/0035401 A1 | 2/2004 | Ramachandran et al. | |

OTHER PUBLICATIONS

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glases: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachl, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2–xSe1+x thin film structures, Phys. Stat. Sol. (a) 74 (1982) 217–224.

Bondarev, V.N.; Pikhitsa, P.V., A dendrite model of current instability in RbAg4I5, Solid State Ionics 70/71 (1994) 72–76.

Boolchand, P., The maximum in glass transition temperature (Tg) near x=1/3 in GexSe1–x Glasses, Asian Journal of Physics (2000) 9, 709–72.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperture (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) 17$^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2627.

Chen, C.H.; Tai, K.L. , Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of SI3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Properties of Ag2–xSe1+x/n–Si diodes, Thin Solid Films 110 (1983) 107–113.

El Gharras, Z.; Bourahla, A.; Vautier, C., Role of photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X. ;Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.-P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.-P.; Rouxel, T.; Sangleboeuf, J.–C; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–SI:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan, J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectronics and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalla, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1–x (0<=x<=0.571) glasses, Solid–state Ionics 123 (1999) 259–269.

Kluge, G.; Thomas, A.; Klabes, R.; Grotzschel, R., Silver photodiffusion in amorphous GexSe100–x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin, R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTi chalcogenide semiconductor film, Thin Solid Films 240 (1994) 143–146.

Kozicki, M.N.; Mitkova, M.; Zhu, J.; Park, M., Nanoscale phase separation in Ag–Ge–Se glasses, Microelectronic Engineering 63 (2002) 155–159.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souguet, J.L, Reversible and irreversible electrical switching In TeO2–V2O5 based glasses, Journal de Physique IV 2 (1992) C2–185 –C2–188.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Miyatani, S.–y., Electronic and ionic conduction in (AgxCu1–x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imal, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil, Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose, M.J.; Hajto, J.; Lecomber, P.G.; Gage, S.M.; Choi, W.K.; Snell, A.J.; Owen, A.E., Amorphous silicon analogue memory devices, J. Non–Cryst. Solids 115 (1989) 168–170.

Rose, M.J.; Snell, A.J.; Lecomber, P.G.; Hajto, J.; Fitzgerald, A.G.; Owen, A.E., Aspects of non–volatility in a –Si:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.; Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant, S.; Peytavin, S.; Ribes, M.; Flank, A.M.; Dexpert, H.; Lagarde, J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov, S.; Petkov, P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag∥As0.24S0.36Ag0.40∥Ag System prepared by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Westwood, J.D.; Georgopoulous, P.; Whitmore, D.H., Structure of glassy fast ion conductors: Differential anomalous X–ray scattering study of a Ag–Ge–Se glass using synchrotron radiation, J. Non–Cryst. Solids 107(1988)88–100.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

"Structure and photoluminescence of the a–$Ge_xSe_{1-x}$ system", Kósa Somogyl, I. And Koós, M., Materials Chemistry and Physics, 10(1984) 237–276.

"Comparison between electrical properties and electronic structure of variously–prepared germanium selenide films", Adriaenssens, G.J.; Gheorghiu, A.; Senemaud, C; Qamhieh, N.; Bolle, N.; Sleeckx, E.; Nagels, P., Journal of Non–Crystalline Solids 198–200 (1996) 675–679.

"Mechanical and chemical thresholds in IV–VI chalcogenide glasses", Asokan, S.' Prasad, M.V.N.; Parthasarathy, G.; Gopal, E.S.R., Physical Review Letters, (1989), 808–810.

"Onset of rigidity in steps in chalcogenide glasses", Properties and Applications of Amorphous Materials, M.F. Thorpe and L. Tichy (eds.), Kluwer Academic Publishers, Printed in the Netherlands, 2001, pp. 97–132.

"Broken chemical order and phase separation in $Ge_xSe_{1-x}$ glasses", Boolchand, P.; Grothaus, J.; Phillips, J.C., Solid State Communications, vol. 45, No. 2, pp. 183–185, (1983).

"Molecular Phase Separation and Cluster Size in $GeSe_2$ Glass", Bresser, W.J.; Boolchand, P.; Suranhi, P.; Hernandez, J.G., Hyperfine Interactions 27 (1986), pp. 389–392.

"Percolation Transition in Ag–doped germanium chalcogenide–based glasses: conductivity and silver diffusion results", Bychkov, E.; Tsegelnik, V.; Vlasov, Y.; Pradel, A.; Ribes, M., Journal of Non–Crystalline Solids 208 (1996) pp. 1–20.

"Photodissolution profile of silver in amorphous chalcogenide $GeSe_x$ thin films," Calas, J.; El Ghrandi, R.; Galibert, G.; Travers, A., Nuclear Instruments and Methods in Physics Research B63 (1992) pp. 462–472.

"Whisker growth induced by Ag photodoping in glassy $Ge_xSe_{1-x}$ films", Chen, C.H.; Tai, K.L., Appl. Phys. Lett. 37(12), (1980), pp. 1075–1077.

"Structure of vitreous Ag–Ge–Se", Dejus, R.J.; Susman, S.; Volin, K.J.; Montague, D.G.; Price, D.L., Journal of Non–Crystalline Solids 143 (1992), pp. 162–180.

"Silver photodissolution in amorphous chalcogenide thin films", Thin Solid Films 218 (1992) pp. 259–273.

Silver photodiffusion in amorphous $Ge_xSe_{100-x}$, Kluge G.; Thomas, A.; Klabes, R.; Grötzschel, R.; Süptitz, P., Journal of Non–Crystalline Solids 124 (1990) pp. 186–193.

"Photoinduced diffusion of Ag in $Ge_xSe_{1-x}$ glass", Leung, W.; Cheung, N.; Neurreuther, A.R., Appl. Phys. Lett. 46, (1985), pp. 543–545.

"Silver incorporation in Ge–Se glasses used in programmable metallization cell devices", Mitkova, M.; Kozicki, M.N., Journal of Non–Crystalline Solids 299–302 (2002) 1023–1027.

"Silver chalcogenide glasses Ag–Ge–Se: Ionic Conduction and Exafs Structural Investigation", Tranchant, S.; Peytavin, S.; Ribes, M.; Flank, A.M.; Dexpert, H.; Lagarde, J.P., Transport–structure relations in fast ion and mixed conductors Proceedings of the $6^{th}$ Riso International symposium, Sep. 9–13, 1985.

"Optically and thermally induced diffusion of silver and its diffusion profiles in amorphous layers of Ge–Se systems", Wagner, T.; Jillkova, R.; Frumar M.; Vlcek, M., Int. J. Electronics, vol. 77, No. 2, 185–191.

"Evidence of Nanopause separation in Ge–Se glasses", Wang, Y.; Tanaka, K.; Nakaoka, T.; Murase, K., Journal of Non–Crystalline Solids 299–302 (2002) 963–967.

"Effect of nanopause separation on crystallization process in Ge–Se glasses studied by Raman scattering", Wang, Y.; Tanaka, K.; Nakaoka, T.; Murase, K., Physica B 316–317 (2002) 568–571.

"Variation of glass transition temperature, $T_g$, with average coordination number, <m>, in network glasses; evidence of a threshold behavior in the slope $|dT_g/d<m>|$ at the rigidity percolation threshold <<m> = 2.4)", Zhang, M.; Mancini, S.; Bresser, W.; Boolchand, P., Journal of Non–Crystalline Solids 151 (1992) 149–154.

"Photoluminescence and Distribution of Tg Values in th GexSe1-x System", by Margit Koos and Istvan Kosa Somogyi, Journal of Non–Crystalline Solids 77 & 78 (1985), pp. 1145–1148.

"Dual Chemical Role of Ag as an Additive in Chaleogenide Glasses", by M. Mitkova, Yu Wang and P. Boolchand, Physical Review Letters, vol. 83, No. 19, Nov. 8, 1999, pp. 38483851.

"Mobile Silver Ions and glass formations in solid electrolytes", by P. Boolchand and W.J. Besser, Letters to Nature, vol. 401, Apr. 26, 2001, pp. 1070–1073.

Yoji Kawamoto, et al., "Ionic Conduction in $As_2S_3$–$Ag_2S$, $GeS_2$–GeS–$Ag_2S$ AND $P_2S_5$–$Ag_2S$ Glasses," Journal of Non–Crystalline Solids 20, pp. 393–404 (1976).

* cited by examiner

STOICHIOMETRY FOR CHALCOGENIDE GLASSES USEFUL FOR MEMORY DEVICES AND METHOD OF FORMATION

This application is a continuation of application Ser. No. 09/941,544, filed on Aug. 30, 2001 now abandoned, which is incorporated herein by reference.

FIELD OF THE INVENTION

The present invention relates to the field of semiconductor devices formed using chalcogenide glasses.

BACKGROUND OF THE INVENTION

One type of integrated circuitry currently used in the semiconductor industry comprises memory circuitry where information is stored in the form of binary data. The circuitry can be either volatile or non-volatile. Volatile storing memory devices result in loss of data when power is interrupted. In contrast, non-volatile memory circuitry retains the stored data even when power is interrupted.

The operation of memory circuitry, and particularly that of programmable metallization cells, has been disclosed in the Kozicki et al. U.S. Pat. Nos. 5,761,115; 5,896,312; 5,914,893; and 6,084,796, the disclosures of which are incorporated by reference herein. Such a cell includes an insulating dielectric material disposed between opposing electrodes. A conductive material is doped into the dielectric material. The resistance of such material can be changed between highly insulative and highly conductive states. In its normal high resistive state and to perform a write operation, a voltage potential is applied across the opposing electrodes. The electrode having the positive voltage applied thereto functions as an anode, while the electrode held at a lower potential functions as a cathode. The conductively-doped dielectric material has the capability of undergoing a structural change at a certain applied voltage. With such voltage applied, a conductive dendrite or filament extends between the electrodes, effectively interconnecting the top and bottom electrodes.

The dendrite remains when the voltage potentials are removed. This way, the resistance of the conductively-doped dielectric material between electrodes could drop by several orders of magnitude. Such material can be returned to its highly resistive state by reversing the voltage potential between the anode and cathode, effectively disrupting the dendrite connection between the top and bottom electrodes. Again, the highly resistive state is maintained once the voltage potential is removed. This way, such a device can function, for example, as a programmable memory cell.

The preferred resistance-variable material received between the electrodes typically comprises a chalcogenide material having metal ions diffused therein. A specific example is germanium selenide ($Ge_xSe_{100-x}$) diffused with silver (Ag) ions. One method of diffusing the silver ions into the germanium selenide material is to initially evaporate the germanium selenide glass and then deposit a thin layer of silver upon the glass, for example by sputtering, physical vapor deposition, or other known technique in the art. The layer of silver is irradiated, preferably with electromagnetic energy at a wavelength less than 600 nanometers, so that the energy passes through the silver and to the silver/glass interface, to break a chalcogenide bond of the chalcogenide material. As a result, the glass is doped with silver. If, however, too much silver is doped into the chalcogenide material, the chalcogenide material changes from an amorphous state to a crystalline one and, consequently, the operation of the programmable memory cell is adversely affected.

When a chalcogenide glass is used in a memory device to insure that its properties do not change during various processing steps associated with fabrication of the memory device, the chalcogenide glass must have a glass transition temperature (Tg) which is about or higher than the fabrication and processing temperatures used in the subsequent steps of memory device fabrication. If the processing and/or packaging temperatures are higher than the glass transition temperature, the amorphous state of the chalcogenide material may change to a crystalline state or the glass stoichiometry may change or the mean coordination number of the glass may change and the operation of the memory cell affected. As such, the glass stoichiometry of the chalcogenide glass must be chosen so that the glass backbone (before and after metal doping) and/or metal-doped glass has a glass transition temperature which is about or higher than the processing temperatures subsequent to the glass deposition or subsequent to metal doping of the glass.

Accordingly, there is a need for a chalcogenide glass material that will remain in a glass forming region when doped with a metal such as silver and which allows maximization of subsequent possible processing temperatures, as well as a method of forming such a non-volatile memory element.

BRIEF SUMMARY OF THE INVENTION

The present invention provides a method of forming non-volatile or semi-volatile memory elements using a metal doped chalcogenide glass which has a stoichometry which keeps the glass in the glass forming region. The glass also has a glass transition temperature (Tg) which is about or higher than typical processing and/or packaging temperatures used for memory device formation.

According to an exemplary embodiment of the present invention, germanium selenide glasses for use as memory elements are selected from a range of germanium selenide glasses having stoichiometries that fall within a first stoichiometric range $R_1$ including $Ge_{18}Se_{82}$ (with a maximum atomic percentage of Ag when doped of about 30% or less) continuously to $Ge_{28}Se_{72}$ (with a maximum atomic percentage of Ag when doped of about 20% or less) and which have the general formula $(Ge_{x1}Se_{100-x1})_{100-y1}Ag_{y1}$, wherein $18 \leq x_1 \leq 28$ and wherein $y_1$ represents the fit silver (Ag) atomic percentage which is the maximum amount which will keep the glass in the glass forming region. Typically, $y_1$ is less than or equal to that which approximately satisfies equation (1):

$$y_1 = 19 + 15 * \sin[0.217 * x_1 + 3.23] \quad (1)$$

According to another embodiment of the present invention, germanium selenide glasses for memory elements are selected from a range of germanium-selenide glasses having stoichiometries that fall within a second stoichiometric range $R_2$ of doped chalcogenide glasses including $Ge_{39}Se_{61}$ (with a maximum atomic percentage of Ag when doped of about 20% or less) continuously to $Ge_{42}Se_{58}$ (with a maximum atomic percentage of Ag when doped of about 15% or less) and which have the general formula $(Ge_{x2}Se_{100-x2})_{100-y2}A_{y2}$, wherein $39 \leq x_2 \leq 42$ and wherein $y_2$ represents the fit silver (Ag) atomic percentage which is the maximum amount which will keep the glass in the glass forming region. Typically, $y_1$ is less than or equal to that which approximately satisfies equation (2):

$$y_2 = 21 - 11.5 * \exp[-(\ln(x_2 44.4)/(0.84)^2)] \quad (2)$$

If the Ag-doped germanium selenide material has a stoichiometry that falls within the first or second stoichiometric range R1, R2, the doped germanium selenide glass will remain amorphous enabling its use in a memory device. If, however, the Ag-doped germanium selenide material has a stoichiometry that does not fall within the first or second stoichiometric range $R_1$, $R_2$, the doped germanium selenide glass becomes crystalline precluding its use in a non-phase change-type memory device.

According to another embodiment of the present invention, and to produce an optimum non-volatile memory cell, the doped germanium selenide glass is selected to fall within the first or second stoichiometric range $R_1$, $R_2$ and to have a glass transition temperature (Tg) which is about or higher than the highest processing and/or packaging temperatures used for memory device formation.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that various structural, logical and electrical changes may be made without departing from the spirit or scope of the invention.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged. Similarly, the terms "germanium" and "selenium" are intended to include not only elemental germanium and selenium, but germanium and selenium with other trace metals or in various alloyed combinations with other metals as known in the semiconductor industry, as long as the physical and electrical properties of the germanium or selenium remain unchanged.

The term "nonvolatile memory device" is intended to include not only non-volatile memory device but also semi-volatile memory devices and any memory device which is capable of maintaining its memory state after power is removed from the device.

The present invention relates to a method of forming non-volatile memory elements under varying glass stoichiometries. The formation of a non-volatile memory device 100 (FIG. 10) including a memory element which comprises a doped chalcogenide glass having a selected stoichiometry will be explained below with reference to FIGS. 2–10. For a better understanding of the invention, however, the selection of a chalcogenide glass having a stoichiometry selected in accordance with the present invention and which is employed in the non-volatile memory device 100 (FIG. 10) is first explained below with reference to FIG. 1.

Figure 1:
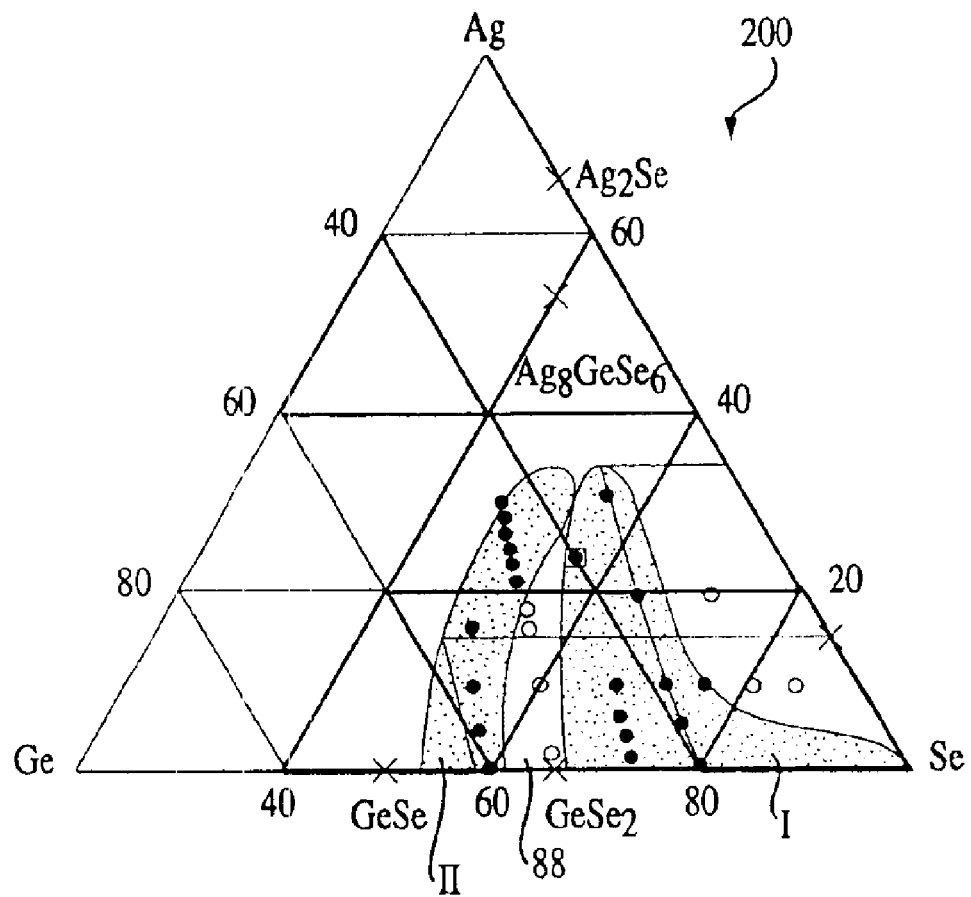
FIG. 1 illustrates a ternary phase diagram showing glass forming regions for $(Ge_xSe_{100-x})_{100-y}Ag_y$ compounds.

Referring to the drawings, where like elements are designated by like reference numerals, FIG. 1 illustrates a ternary phase diagram 200 showing glass forming regions for $(Ge_xSe_{100-x})_{100-y}Ag_y$ compounds (i.e., regions in the phase diagram where $(Ge_xSe_{100-x})_{100-y}Ag_y$ compounds exist in the glass phase), as studied by Mitkova et al. in *Dual Chemical Role of Ag as an Additive in Chalcogenide Glasses*, Phys. Rev. Letters, Vol. 83, No 19 (November 1999), the disclosure of which is incorporated by reference herein. According to Mitkova et al. and as shown in FIG. 1, ternary $(Ge_xSe_{100-x})_{100-y}Ag_y$ glasses which comprise germanium selenide glasses with silver (Ag) as an additive form in two distinct compositional regions: a selenium-rich region labeled region I (FIG. 1) and a germanium-rich region labeled region II (FIG. 1). As also shown in FIG. 1, a corridor 88 separates the selenium-rich region I from the germanium-rich region II. Mitkova et al. mentions that no bulk glass formation occurs along the corridor 88 until the silver (Ag) concentration exceeds $y \geq 0.2$ and the two selenium-rich and germanium-rich regions I and II coalesce.

The study conducted by Mitkova et al. concluded that silver (Ag) acts as a "network modifier" for the glass compositions of the selenium-rich region I (FIG. 1). In this region, silver (Ag) phase separates into an $Ag_2Se$-rich phase and a $Ge_xSe_{100-t}$ phase which has less Se than the starting $Ge_xSe_{100-x}$ material. In contrast, in the germanium-rich region I (FIG. 1), silver (Ag) acts as a "network former" for glass compositions, forms part of the backbone and reduces the connectivity of the glass.

Referring back to FIG. 1 and further analyzing the ternary phase diagram with glass forming regions for $(Ge_xSe_{100-x})_{100-y}Ag_y$ compounds, Applicant has discovered that the careful selection of the stoichiometry of a chalcogenide glass is directly correlated to the ability of the doped chalcogenide glass to maintain an amorphous state over a wide and continuous range of dopant metal concentrations and, therefore, to successfully function as a programmable memory cell.

Accordingly, Applicant has discovered that, contrary to current belief in the semiconductor art, not all doped germanium selenide glass stoichiometries could be successfully used as non-volatile or semi-volatile memory devices. Applicant has discovered that optimization of a doped germanium selenide glass for switching operations in memory devices requires the doped germanium selenide glass all fully within a glass forming region, such as the glass forming regions I and II of FIG. 1 of Mitkova et al. In addition, for use in a memory device, the germanium selenide glass must have a glass transition temperature (Tg) high enough to allow the doped germanium selenide glass to withstand temperatures of subsequent wafer processing and/or chip packaging processes, for example wire bonding or encapsulation.

According to the present invention, germanium selenide glass compositions capable of creating functional non-volatile memory devices require glass stoichiometries to fall in one of the following two ranges:

a first stoichiometric range $R_1$ including $Ge_{18}Se_{82}$ (with a maximum atomic percentage of Ag when doped of about 30% or less) continuously to $Ge_{28}Se_{72}$ (with a maximum atomic percentage of Ag when doped of about 20% or less) and which have the general formula $(Ge_{x1}Se_{100-x1})_{100-y1}Ag_{y1}$, wherein $18 \leq x_1 \leq 28$ and wherein $y_1$ represents the fit silver (Ag) atomic percentage which is the maximum amount which will keep the glass in the glass forming region. Typically, $y_1$ is less than or equal to that which approximately satisfies equation (1):

$$y_1 = 19 + 15 \ast \sin[0.217 \ast x_1 + 3.231] \quad (1)$$

or a second stoichiometric range $R_2$ of doped chalcogenide glasses including $Ge_{39}Se_{61}$ (with a maximum atomic percentage of Ag when doped of about 20% or less) continuously to $Ge_{42}Se_{58}$ (with a maximum atomic percentage of Ag when doped of about 15% or less) and which have the general formula $(Ge_{x2}Se_{100-x2})_{100-y2}$ $Ag_{y2}$, wherein $39 \leq x_2 \leq 42$ and wherein $y_2$ represents the fit silver (Ag) atomic percentage which is the maximum amount which will keep the glass in the glass forming region. Typically, $y_1$ is less than or equal to that which approximately satisfies equation (2):

$$y_2 = 21 - 11.5 \ast \exp[-(\ln(x_2/44.4)/(0.84)^2)] \quad (2)$$

For example, germanium selenide glasses having a selenium (Se) composition of about 62% to about 71% will not be able to form functional memory devices as the doped glass falls within the coridor 88 (FIG. 1) and out of the first and second stoichiometric ranges $R_1$, $R_2$, described above. For example; a memory device using a doped germanium selenide glass having a selenium (Se) composition of about 63.5% and a silver (Ag) doping between about 7% to about 22% fails after one write/erase data retention cycle.

Similarly, germanium selenide glasses having a selenium (Se) composition greater than about 82% will also not be able to form functional memory devices, as they fall out of the first and second stoichiometric ranges $R_1$, $R_2$ described above, when the amount of silver (Ag) dopant is sufficient for the switching operation. Doped chalcogenide germanium selenide glasses having a selenium (Se) composition less than about 58% will also be incapable of forming functional memory devices since the maximum amount of silver (Ag) dopant allowable to remain in glass forming region $R_2$ is insufficient for the switching operation (the maximum silver atomic percentage is lower than about 7%).

The following Table 1 is a compilation of data on silver-doped germanium selenide glasses used as non-volatile memory cells obtained by the Applicant. Carefully choosing the stoichiometry of the silver-doped germanium selenide glass to fall either within the first or second stoichiometric range $R_1$, $R_2$ described above allows the silver-doped germanium selenide glass to function as a non-volatile memory cell. This is because, above 82% Se, the maximum allowable Ag falls rapidly to less than 10% Ag allowed to remain in the glass forming region. This amount of Ag is insufficient to obtain good electrical switching.

TABLE 1

| | Edge | | | Glass forming region Ag | Ag-doped glass in |
|---|---|---|---|---|---|
| Lot #, Wfr # | at. % Se | at. % Ge | Functional? | ternary phase diagram | glass forming region? |
| 0641274, wfr 5 | 63.5 | 36.5 | Initially Yes; Fails after a write/erase data retention cycle. | >~7 and <~22 at. % Ag | Only initially. |
| 0440263, wfr 14 | 68.5 | 31.5 | No. Poor write erase characteristics and limited data retention. | >~18 and <~30 at. % Ag | No. |
| 0540868, wfr 5 | 83.9 | 16.1 | No. Devices would not switch, remaining in low resistance state characteristic of too much Ag in the glass. | <~10 at. % Ag | No. |
| 0440263, wfr 12 | 85.2 | 14.8 | No. Devices that would write were threshold switches. | <~7 at. % Ag | No. |
| 0440263, wfr 8 | 80 | 20 | Yes. Good write characteristics and data retention. Good subsequent erases. | up to 34 at. % Ag | Yes. |
| 1344272, wfr 1 | 77 | 23 | Yes. Good write and erase characteristics. | up to ~33 at. % Ag | Yes. |
| 2349273, wfr 7 | 75 | 25 | Yes. Good write and erase characteristics | up to ~33 at. % Ag | Yes. |

The $Ge_{20}Se_{80}$ glass doped with Ag up to 34% (Table 1) falls entirely within the first stoichiometric range $R_1$ of doped germanium selenide glasses and, therefore, falls within the glass forming regions of the present invention. Memory cells employing such $Ge_{20}Se_{80}$ glass doped with Ag up to 34% exhibit good write/erase characteristics and are fully functional. Additionally, memory cells with $Ge_{23}Se_{77}$ and $Ge_{25}Se_{75}$ doped with up to 33% Ag exhibit good write/erase characteristics. In contrast, the first four silver-doped germanium selenide compositions of Table 1 fall out of the glass forming regions when doped with an adequate amount of Ag for good electrical switching. Accordingly, the memory cells which use such silver-doped germanium selenide compositions are all non-functional because the devices do not switch and/or have poor write/erase characteristics. Out of the four non-functional silver-doped germanium selenide compositions of Table 1, only the $Ge_{36.5}Se_{63.5}$ doped with silver (Ag) with an atomic percentage greater that about 7% but smaller than about 22% exhibits initially good write/erase characteristics, but fails after one cycle.

The data of Table 1 supports Applicant's observation that functional non-volatile memory devices based on a doped germanium selenide glass composition require such glass composition to have a particular stoichiometry that falls within one of the first or second stoichiometric range $R_1$, $R_2$ described above. However, as noted above, optimization of functional memory devices based on doped germanium selenide glasses requires glass transition temperatures (Tg) that allow the doped germanium selenide glasses to withstand temperatures for conventional fabrication and/or packaging processes, for example, wire bonding or encapsulation. Thus, in accordance with an embodiment of the present invention, germanium selenide glasses for non-volatile or semi-volatile memory devices have stoichiometries that fall within the two stoichiometric ranges $R_1$, $R_2$ described above, and have also a glass transition temperature (Tg) which is about or higher than the processing and/or packaging temperatures.

Table 2 lists glass transition temperatures (Tg) measured for nine germanium selenide chalcogenide glasses:

TABLE 2

| Tg | at. % Ge | at. % Se |
|---|---|---|
| 107.39 | 12 | 88 |
| 165.54 | 18 | 82 |
| 183.91 | 20 | 80 |
| 209.37 | 23 | 77 |
| 228.57 | 24 | 76 |
| 249.1 | 25 | 75 |
| 334.83 | 30 | 70 |
| 415.76 | 33 | 67 |
| 346.67 | 40 | 60 |

Typical temperatures for packaging of non-volatile memory devices are of about 170° C. to about 190° C. (e.g., for encapsulation) and can be as high as 230° C. (e.g., for wire bonding). Typical processing steps during the fabrication of such non-volatile memory devices, for example photoresist and/or nitride deposition processes, can also take place at temperatures of about 200° C. Accordingly, to obtain a viable chalcogenide glass composition for a memory cell of a memory device, the stoichiometry must fall within the first or second stoichiometric ranges $R_1$, $R_2$ discussed above and must have a glass transition temperature (Tg) which is about or higher than the highest packaging and/or processing temperatures used during the formation of the memory device or of the packaging of the memory device itself. This way, the selection of a germanium selenide glass for a functional memory cell accounts for both a stoichiometry that falls within glass forming regions and an adequate glass transition temperature (Tg). For example, a $Ge_{25}Se_{75}$ glass is a good candidate for a non-volatile memory device because the $Ge_{25}Se_{75}$ glass falls within the first stoichiometric range $R_1$ described above and it also has a glass transition temperature (Tg) of about 250° C. Another good candidate is a $Ge_{40}Se_{60}$ glass because it also falls within the second stoichiometric range R described above and has a glass transition temperature (Tg) of about 347° C.

Figure 2:
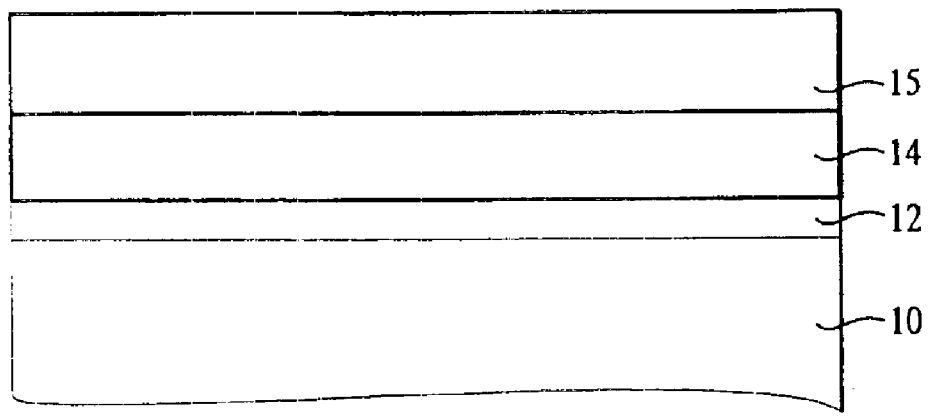
FIG. 2 illustrates a cross-sectional view of the early stages of fabrication of a a memory device in accordance with an embodiment of the present invention.

Reference is now made to FIGS. 2–10 which illustrate an exemplary embodiment of a non-volatile memory device 100 (FIG. 10) using a doped germanium selenide glass selected in accordance with the present invention. FIG. 2 depicts a portion of an insulating layer 12 formed over a semiconductor substrate 10. The insulating layer 12 may be formed by any known deposition methods, such as sputtering by chemical vapor deposition (CVD), plasma enhanced CVD (PECVD) or physical vapor deposition (PVD), among others. The insulating layer 12 may be formed of a conventional insulating oxide, such as silicon oxide ($SiO_2$), a silicon nitride ($Si_3N_4$), or a low dielectric constant material, among many others.

A first electrode 14 is next formed over the insulating layer 12, as also illustrated in FIG. 2. The first electrode 14 comprises any conductive material, for example, tungsten, tantalum, titanium, platinum, or silver, among many others. A dielectric layer 15 (FIG. 2) is next formed over the first electrode 14. The dielectric layer 15 may comprise similar materials to those described above with reference to the insulating layer 12.

Figure 3:
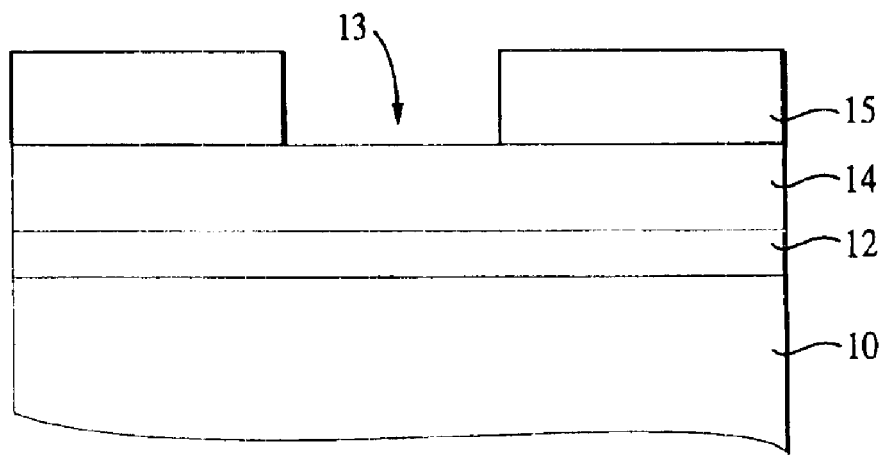
FIG. 3 illustrates a cross-sectional view of the memory device of FIG. 2 at a stage of processing subsequent to that shown in FIG. 2.
Figure 4:
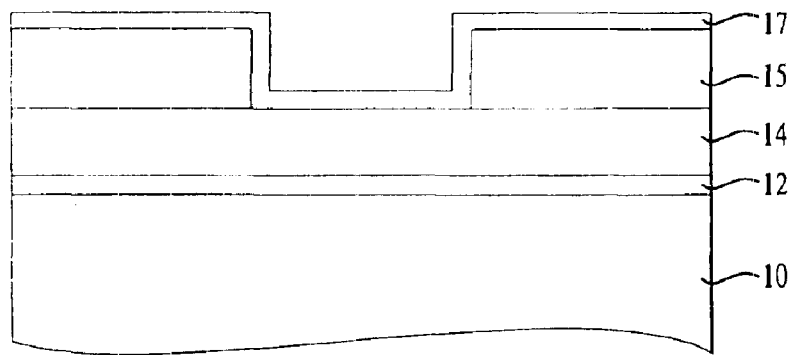
FIG. 4 illustrates a cross-sectional view of the memory device of FIG. 2 at a stage of processing subsequent to that shown in FIG. 3.

Referring now to FIG. 3, an opening 13 is formed in the dielectric layer 15 and extending to the first electrode 14. The opening 13 may be formed by known methods of the art, for example, by a conventional patterning and etching process. A chalcogenide glass 17 is next formed over the dielectric layer 15, to fill in the opening 13, as shown in FIG. 4.

According to an embodiment of the present invention, the chalcogenide glass 17 is a germanium selenide glass having a $Ge_{23}Se_{77}$ stoichiometry that falls within the first stoichiometric range $R_1$ and within a glass forming region of the present invention. The formation of the germanium selenide glass 17 with $Ge_{23}Se_{77}$ stoichiometry in accordance with one exemplary embodiment may be accomplished by evaporating a germanium selenide glass which has been synthesized with the exact stoichiometries, i.e. 23% germanium and 77% selenium. In accordance with another exemplary embodiment, the germanium selenide glass 17 with $Ge_{23}Se_{77}$ stoichiometry is formed by co-sputtering germanium and selenium in the appropriate ratios, or by sputtering using a $Ge_{23}Se_{77}$ target. In yet another embodiment of the invention, the germanium selenide glass 17 with $Ge_{23}Se_{77}$ stoichiometry is formed by chemical vapor deposition with stoichiometric amounts of $GeH_4$ and $SeH_2$ gases (or various compositions of these gases) which result in a $Ge_{23}Se_{77}$ film.

Once the germanium selenide glass 17 with the desired stoichiometry has been formed, the doping concentration of the silver dopant is selected with a maximum concentration in accordance with the ternary phase diagram of FIG. 1 and the equations (1) and (2) outlined above. Accordingly, for the germanium selenide glass 17 with a $Ge_{23}Se_{77}$ stoichiometry, the maximum silver doping is about 33%.

Figure 5:
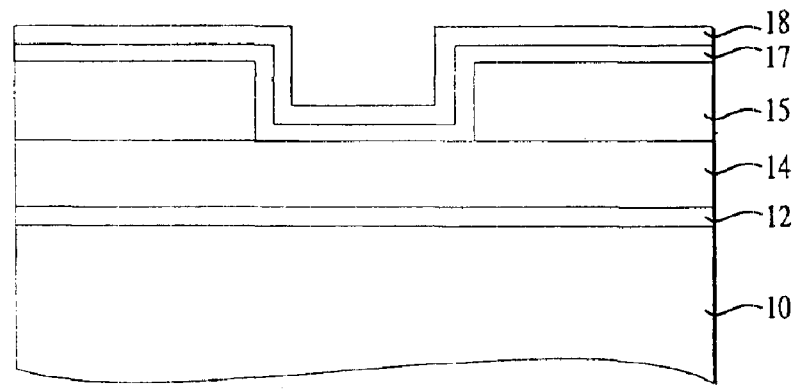
FIG. 5 illustrates a cross-sectional view of the memory device of FIG. 2 at a stage of processing subsequent to that shown in FIG. 4.
Figure 6:
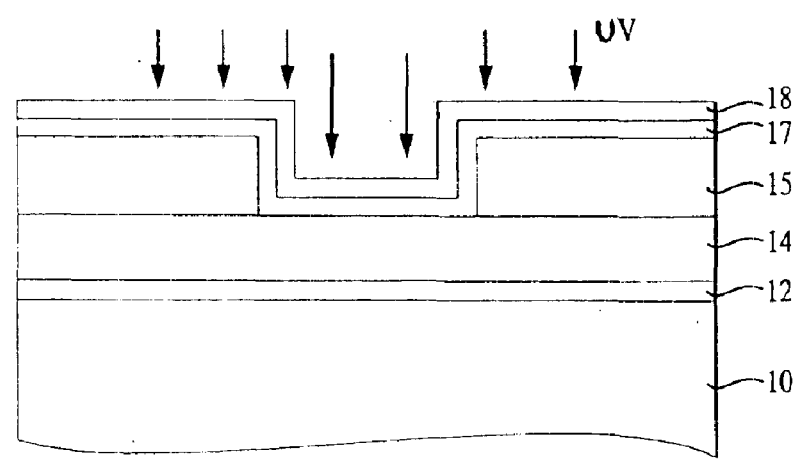
FIG. 6 illustrates a cross-sectional view of the memory device of FIG. 2 at a stage of processing subsequent to that shown in FIG. 5.
Figure 7:
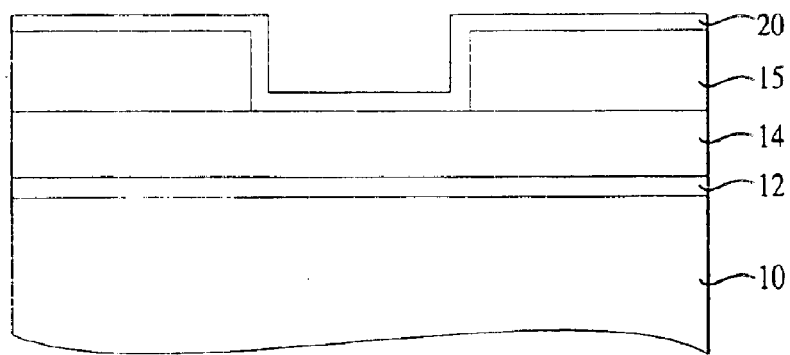
FIG. 7 illustrates a cross-sectional view of the memory device of FIG. 2 at a stage of processing subsequent to that shown in FIG. 6.

Referring now to FIG. 5, incorporation of silver into the $Ge_{23}Se_{77}$ glass 17 may be accomplished by photodoping, that is depositing a thin layer 18 comprising silver, preferably predominantly elemental silver, over the $Ge_2Se_{77}$ glass 17 and then "driving" the silver atoms within the $Ge_{23}Se_{77}$ glass by using light (FIG. 6), or by co-sputtering with Ag, Ge and Se, or Ag and a $Ge_{23}Se_{77}$ target, or $Ag_2Se$ and $Ge_xSe_{100-x}$. The thickness of the layer 18 comprising silver is selected so that, when the silver is subsequently diffused into the germanium selenide glass layer 17, the atomic percentage of Ag in resulting silver-doped chalcogenide glass 20 (FIG. 7) will allow such glass to fall within a glass forming region $R_1$ or $R_2$.

Depending upon the glass stoichiometry, the silver atoms will either incorporate themselves into the glass backbone (the Ge-Se structure) or react with Se to form $Ag_2Se$, leaving behind a silver-doped germanium selenide glass 20 (FIG. 7) with a new Ge-Se stoichiometry. Thus, when about 33% of silver is incorporated into the $Ge_{23}Se_{77}$ glass, the system phase separates into an $Ag_2Se$ phase and a $Ge_{30}Se_{70}$ backbone glass.

As mentioned above, the proper selection of the germanium selenide glass for the memory element 100 (FIG. 10) requires the doped germanium selenide glass to fall within the glass forming region and to have a glass transition temperature (Tg) which is about or higher than the highest fabrication and/or packaging processing temperatures. Thus, for the exemplary embodiment described above, the silver-doped $Ge_{23}Se_{77}$ glass 20 of the memory device 100 (FIG. 10) can withstand processing temperatures at least as high as about 210° C.

Figure 8:
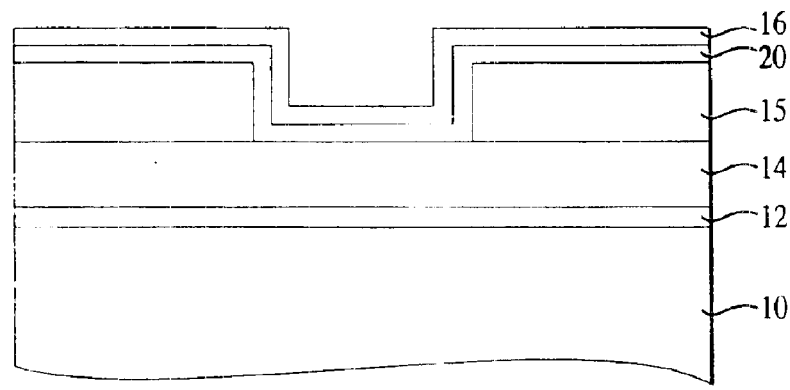
FIG. 8 illustrates a cross-sectional view of the memory device of FIG. 2 at a stage of processing subsequent to that shown in FIG. 7.
Figure 9:
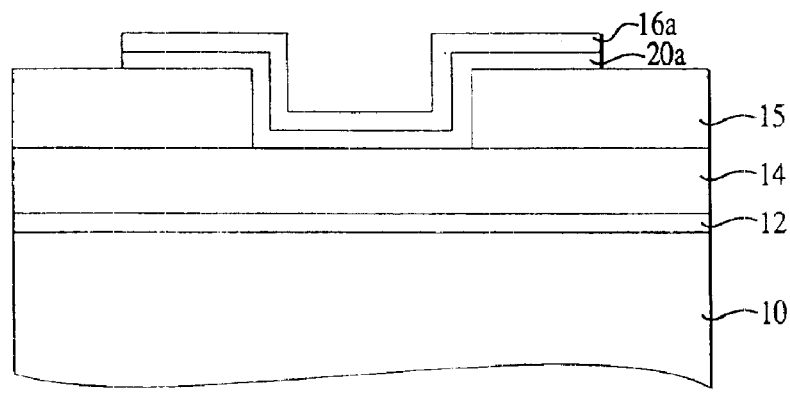
FIG. 9 illustrates a cross-sectional view of the memory device of FIG. 2 at a stage of processing subsequent to that shown in FIG. 8.

Referring now to FIG. 8, a second conductive electrode material 16 is formed over the doped germanium selenide glass 20. The second conductive electrode material 16 may comprise any electrical conductive material, for example, tungsten, tantalum, titanium, or silver, among many others, as long as it is a different material than the first electrode 14.

Figure 10:
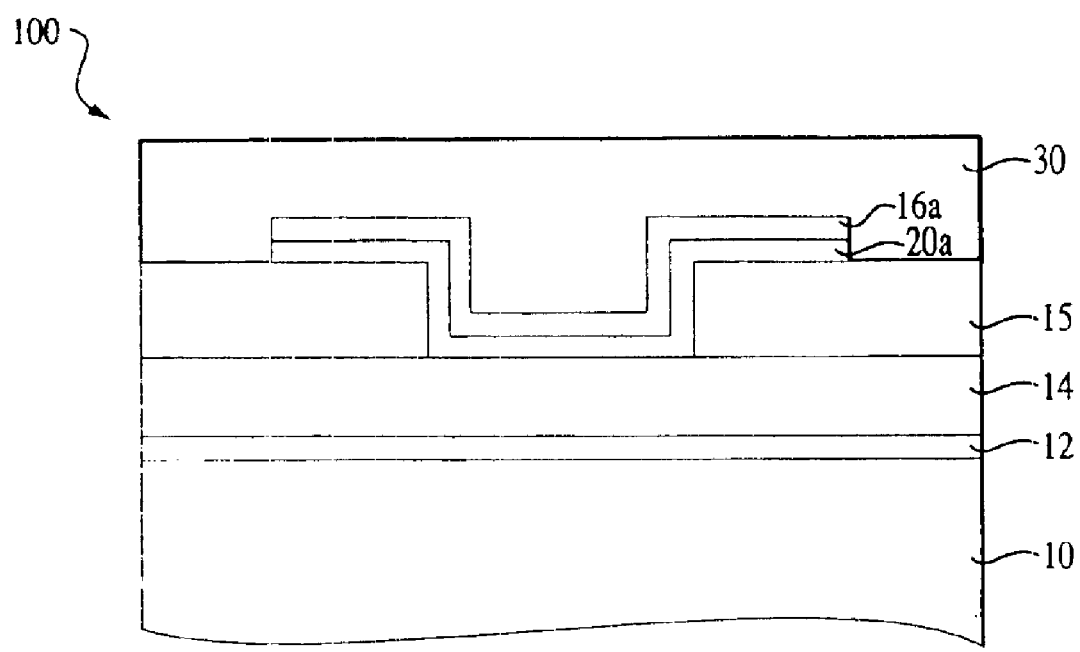
FIG. 10 illustrates a cross-sectional view of the memory device of FIG. 2 at a stage of processing subsequent to that shown in FIG. 9.

After the formation of the second conductive electrode material 16 (FIG. 8), further steps to create a functional memory cell may be carried out. Patterning by photolithography, for example, may be employed to produce memory element 20*a* and second electrode 16*a*, illustrated in FIG. 9. Referring now to FIG. 10, one or more dielectric layers 30 are formed over the second electrode 16*a* and the dielectric layer 15 to complete the formation of the non-volatile memory device 100 (FIG. 10). Conventional processing steps can be further carried out to electrically couple the second electrode 16*a* to various circuits of memory arrays. Alternatively, additional multilevel interconnect layers and associated dielectric layers could be formed from the memory cell 100 to appropriate regions of the substrate 10, as desired.

Although only two electrodes 14, 16*a* are shown in FIGS. 2–10, it must be readily apparent to those skilled in the art that in fact any number of such electrodes may be formed. In addition, although the embodiments described above refer to the formation of only one non-volatile memory cell 100, it must be understood that the present invention contemplates the formation of any number of such non-volatile memory cells.

Although an exemplary memory cell fabrication has been described above using a $Ge_{23}Se_7$ composition, other Ge/Se stoichiometries for the glass composition within the R1, R2 ranges described above, besides $Ge_{23}Se_{77}$, can be used. For example, $Ge_{25}Se_{75}$ and $Ge_{20}Se_{80}$ compositions have been found to be particularly good compositions for memory cell fabrication.

Although the present invention has been explained with reference to the formation of a doped germanium selenide glass with a stoichiometry selected according to the present invention, the invention is not limited to this embodiment and has applicability to other chalcogenide glasses. Accordingly, the stoichiometry of any chalcogenide glass comprising any one of oxygen (O), sulfur (S), selenium (Se) and tellurium (Te) and doped with a metal dopant may be selected so that the doped chalcogenide glass maintains an amorphous state over a wide and continuous range of dopant metal concentrations. Thus, the present invention contemplates any doped chalcogenide glass that falls fully within a glass-forming region (corresponding to a respective ternary phase diagram for a particular chalcogenide glass) and has a glass transition temperature (Tg) which is about or higher than the highest processing temperature for memory device fabrication.

Further, although the invention has been explained with reference to the formation of a germanium selenide glass doped with silver, other dopants may be used also, depending on the device characteristics and as desired. Thus, the invention also contemplates chalcogenide glasses doped with copper, platinum, gold, silver, cadmium, iridium, ruthenium, cobalt, chromium, maganese or nickel, among many others.

Figure 11:
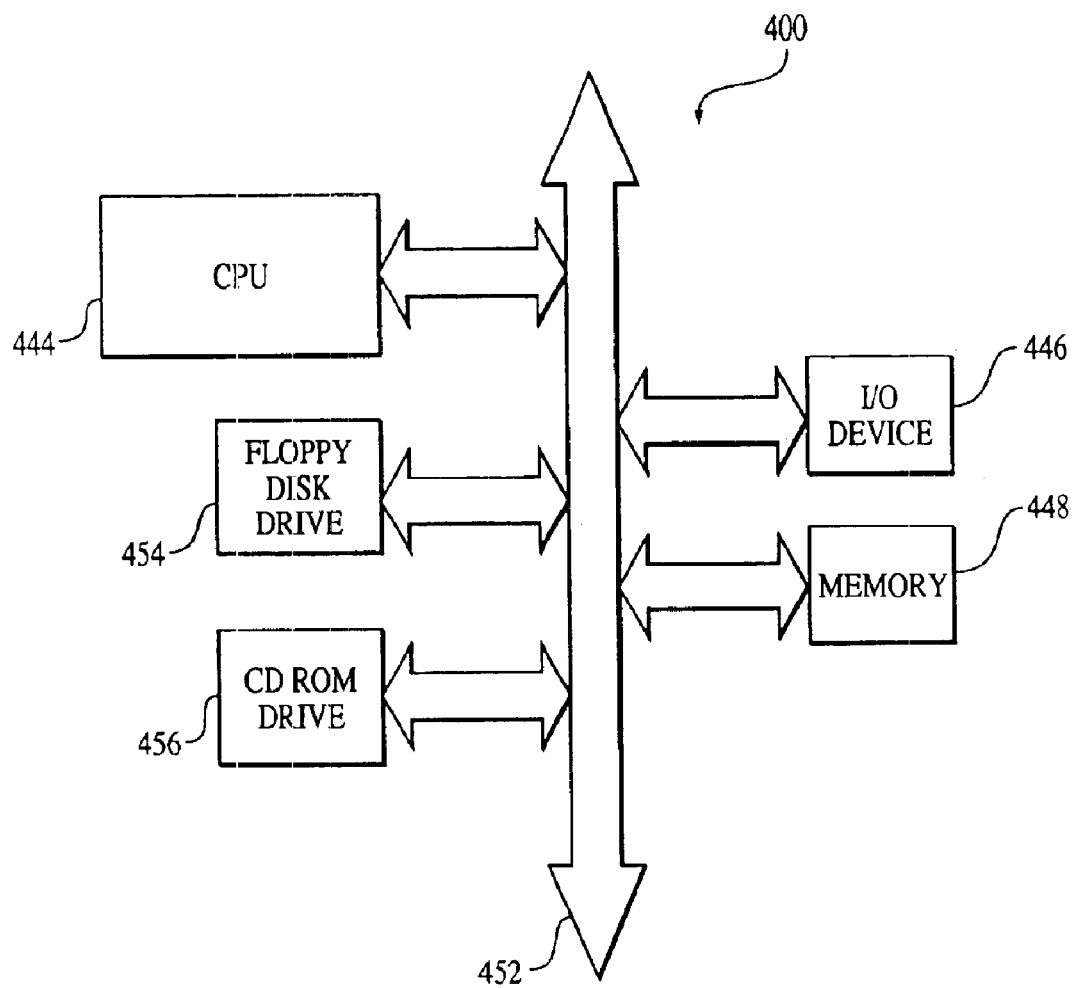
FIG. 11 illustrates a computer system having a memory cell formed according to the present invention.

A typical processor-based system 400 which includes a memory circuit 448, for example a PCRAM, one or both of which contain non-volatile or semi-volatile memory cells, such as the non-volatile memory cell 100 according to the present invention is illustrated in FIG. 11. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448 is preferably constructed as an integrated circuit, which includes one or more non-volatile memory cells 100. If desired, the memory 448 may be combined with the processor, for example CPU 444, in a single integrated circuit.

The above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed is:

1. A non-volatile memory cell comprising:

a germanium selenide glass comprising silver, said germanium selenide glass having the formula $(Ge_xSe_{100-x})_{100-y}Ag_y$, wherein $39 \leq x \leq 42$ and y corresponds to a stoichiometric amount of silver suitable to maintain said germanium selenide glass in a non-crystalline state; and a first electrode and a second electrode in electrical communication with said germanium selenide glass.

2. A memory cell comprising:

a germanium selenide glass comprising silver, said germanium selenide glass having the formula $(Ge_xSe_{100-x})_{100-y}Ag_y$, wherein is at least 40 and y corresponds to a stoichiometric amount of silver suitable to maintain said germanium selenide glass in a non-crystalline state; and at least two electrodes to separated by at least a portion of said germanium selenide glass.

3. A memory cell comprising:

a germanium selenide glass having the formula $(Ge_xSe_{100-x})_{100-y}Ag_y$, wherein x is substantially equal to and y corresponds to a stoichiometric amount of silver suitable to maintain said germanium selenide glass in a non-crystalline state; and at least two electrodes in electrical communication with said germanium selenide glass.

4. A method of forming a memory cell comprising the steps of:

providing a germanium selenide glass having the formula $(Ge_xSe_{100-x})_{100-y}Ag_y$, wherein x is at least 39, over a substrate, and y corresponds to a stoichiometric amount of silver suitable to maintain said germanium selenide glass in a non-crystalline state; and forming at least two electrodes electrically coupled to said germanium selenide glass at locations which permit said glass to transition between high and low resistance states in response to signals applied to said electrodes.

5. The method of claim 4, wherein x=40.
6. The method of claim 4, wherein x=41.
7. The method of claim 4, wherein x=42.
8. A method of forming a memory cell, comprising:

providing a germanium selenide glass having the formula $(Ge_xSe_{100-x})$, wherein $39 \leq x \leq 42$; and adding an amount of silver to said germanium selenide glass corresponding to a stoichiometric amount suitable to maintain said germanium selenide glass in a non-crystalline state; and, providing at least two electrodes electrically coupled to said germanium selenide glass at locations which permit said electrodes to apply bipolar charge across said germanium selenide glass.

9. A method of operating a memory cell, comprising:

applying a voltage across a germanium selenide glass having the formula $(Ge_xSe_{100-x})_{100-y}Ag_y$, wherein x is at least 39 and y corresponds to a stoichiometric amount of silver suitable to maintain said germanium selenide glass in a non-crystalline state, said voltage application changing a resistance state of said glass.

10. The method of claim 9, wherein x=40.
11. The method of claim 9, wherein x=41.
12. The method of claim 9, wherein x=42.
13. A method of operating a memory cell, comprising:

applying a voltage across a germanium selenide glass having the formula $(Ge_xSe_{100-x})_{100-y}Ag_y$, wherein $39 \leq x \leq 42$ and y corresponds to a stoichiometric amount of silver suitable to maintain said germanium selenide glass in a noncrystalline state, said voltage application changing a resistance state of said glass.

14. A processor system comprising:

a processor; and an integrated circuit coupled to said processor, at least one of said processor and integrated circuit including a memory cell, said memory cell comprising:

a germanium selenide glass having the formula $(Ge_xSe_{100-x})_{100-y}Ag_y$, wherein x is at least 39 and y corresponds to a stoichiometric amount of silver suitable to maintain said germanium selenide glass in a non-crystalline state; and at least two electrodes electrically coupled to said germanium selenide glass, said germanium selenide glass changing a resistance state in response to application of a voltage across said at least two electrodes.

15. The processor system of claim 14, wherein said processor and said integrated circuit are integrated on same chip.

16. The processor system of claim 14, wherein x=40.
17. The processor system of claim 14, wherein x=41.
18. The processor system of claim 14, wherein x=42.
19. A processor system comprising:

a processor; and an integrated circuit coupled to said processor, at least one of said processor and integrated circuit including a memory cell, said memory cell comprising:

a germanium selenide glass having the formula $(Ge_xSe_{100-x})_{100-y}Ag_y$, wherein $39 \leq x \leq 42$ and y corresponds to a stoichiometric amount of silver suitable to maintain said germanium selenide glass in a non-crystalline state; and a least two electrodes electrically coupled to said germanium selenide glass, said germanium selenide glass changing a resistance state in response to application of a voltage across said at least two electrodes.

20. The processor-based system of claim 19, wherein said processor and said integrated circuit are integrated on same chip.

* * * * *

UNITED STATES PATENT AND TRADEMARK OFFICE
CERTIFICATE OF CORRECTION

PATENT NO.      : 6,888,155 B2
DATED           : May 3, 2005
INVENTOR(S)     : Kristy A. Campbell It is certified that error appears in the above-identified patent and that said Letters Patent is hereby corrected as shown below:

Title page,
Item [56], References Cited, OTHER PUBLICATIONS,
"Bernede, J. C.; Abachl, T., Differential negative resistance in metal/insulator/metal structures with an upper bilayer electrode, Thin solid films 131 (1985) L61-L64." should read
--Bernede, J.C.; Abachi, T., Differential negative resistance in metal/insulator/metal structures with an upper bilayer electrode, Thin solid films 131 (1985) L61-L64.--;

""Photoluminescence and Distribution of Tg Values in th GexSe1-x System ", by Margit Koos and Istvan Kosa Somogyi, Journal of Non-Crystalline Solids 77 & 78 (1985), pp. 1145-1148." should read
-- "Photoluminescence and Distribution of Tg Values in the GexSe1-x System ", by Margit Koos and Istvan Kosa Somogyi, Journal of Non-Crystalline Solids 77 & 78 (1985), pp. 1145-1148. --; and ""Dual Chemical Role of Ag as an Additive in Chalcogenide Glasses", by M. Mitkova, Yu Wang and P. Boolchand, Physical Review Letters, vol. 83, No. 19, Nov. 8, 1999, pp. 38483851." should read
-- "Dual Chemical Role of Ag as an Additive in Chalcogenide Glasses", by M. Mitkova, Yu Wang and P. Boolchand, Physical Review Letters, Vol. 83, No. 19, Nov. 8, 1999, pp. 3848-3851. --;

Column 2,
Line 39, "doped of" should read -- doped to --;
Line 65, "(1n($x_2$44.4)" should read -- (1n($x_2$/44.4) --;

Column 4,
Line 42, "region I" should read -- region II --;

Column 5,
Line 16, "+3.231]" should read -- +3.23] --;

Column 7,
Line 62, "R" should read -- $R_2$ --;

Column 8,
Line 53, "$Ge_2Se_{77}$" should read -- $Ge_{23}Se_{77}$ --;

UNITED STATES PATENT AND TRADEMARK OFFICE
CERTIFICATE OF CORRECTION

PATENT NO. : 6,888,155 B2
DATED : May 3, 2005
INVENTOR(S) : Kristy A. Campbell

It is certified that error appears in the above-identified patent and that said Letters Patent is hereby corrected as shown below:

Column 9,
Line 43, "$Ge_{23}Se_7$" should read -- $Ge_{23}Se_{77}$ --;

Column 10,
Line 49, "wherein is" should read -- wherein x is --;
Line 53, "electrodes to separated" should read -- electrodes separated --; and
Line 58, "to and" should read -- to 40 and --.

Signed and Sealed this

Eighteenth Day of April, 2006

JON W. DUDAS
*Director of the United States Patent and Trademark Office*